(12) United States Patent
Watarai

(10) Patent No.: US 8,080,883 B2
(45) Date of Patent: Dec. 20, 2011

(54) WIRING PLACEMENT METHOD OF WIRINGS HAVING DIFFERENT LENGTH AND SEMICONDUCTOR INTEGRATED CIRCUIT DEVICE

(75) Inventor: Tamotsu Watarai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/320,784

(22) Filed: Feb. 4, 2009

(65) Prior Publication Data

US 2009/0207581 A1    Aug. 20, 2009

(30) Foreign Application Priority Data

Feb. 15, 2008  (JP) ................. 2008-034746

(51) Int. Cl.
*H01L 23/48* (2006.01)
(52) U.S. Cl. ............... 257/775; 257/776; 257/E23.046; 257/E23.07; 438/599
(58) Field of Classification Search .................. 257/773, 257/775, 776, E23.046, E23.07; 438/129, 438/599
See application file for complete search history.

(56) References Cited

U.S. PATENT DOCUMENTS

| 5,473,195 | A | 12/1995 | Koike | |
|---|---|---|---|---|
| 5,723,908 | A * | 3/1998 | Fuchida et al. | 257/758 |
| 7,739,624 | B2 * | 6/2010 | McElvain et al. | 716/101 |

FOREIGN PATENT DOCUMENTS

| JP | 6-302694 | 10/1994 |
|---|---|---|
| JP | 2005-101587 | 4/2005 |

* cited by examiner

*Primary Examiner* — Julio J Maldonado
(74) *Attorney, Agent, or Firm* — McGinn IP Law Group, PLLC

(57) ABSTRACT

A longest wiring and a shortest wiring alongside each other among the plurality of wirings are placed. Then, a longest wiring from among remaining wires which have not being placed yet, alongside an outside of a space surrounded by the wirings already placed and on a side of a shorter wiring of the wrings placed at outermost ends are placed. A shortest wiring from among remaining wires which have not placed yet, alongside an outside of a space surrounded by the wirings already placed and on a side of a longer wiring of the wirings placed at outermost ends is placed. These two processes are repeated.

4 Claims, 13 Drawing Sheets

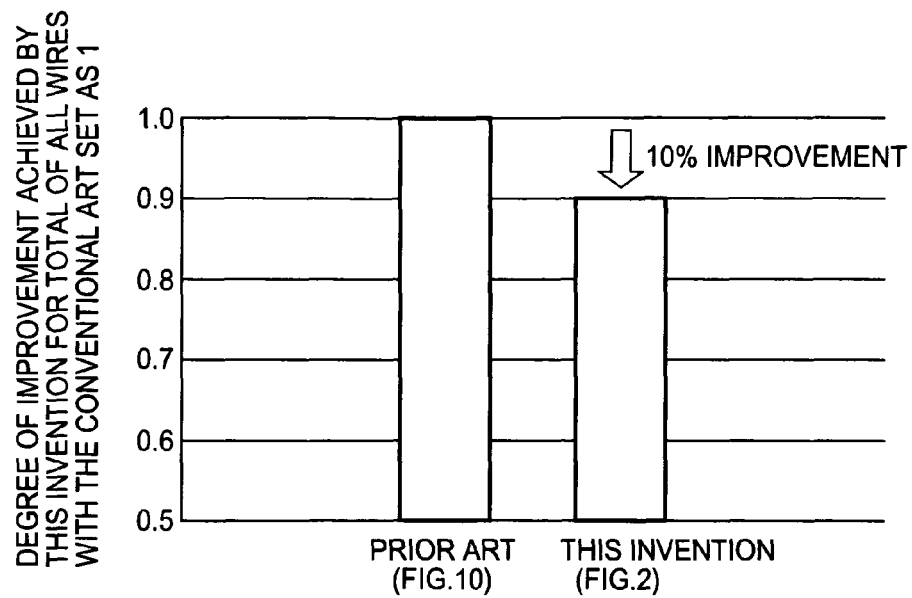

RELATED ART

RELATED ART

RELATED ART

RELATED ART

RELATED ART

WIRING PLACEMENT METHOD OF WIRINGS HAVING DIFFERENT LENGTH AND SEMICONDUCTOR INTEGRATED CIRCUIT DEVICE

BACKGROUND OF THE INVENTION

1. Field of the Invention

This invention relates to a wiring placement method and to a semiconductor integrated circuit device utilizing that wiring placement method.

2. Description of Related Art

Reducing timing delays and current consumption is a major problem when designing semiconductor integrated circuit devices. As semiconductor integrated circuit devices achieve higher performance, greater attention is being focused on effects that inter-wiring capacitance exerts on timing delays and current consumption. The smaller the inter-wiring capacitance, the more that timing delays and power consumption are reduced. Minimizing this inter-wiring capacitance by optimal wiring placement in semiconductor integrated circuit devices is therefore essential.

Wiring placement in semiconductor integrated circuit devices with multiple layer wiring structures in the conventional art is described next. FIG. 10 shows an example of wiring connections between the start point group and end point group in a region on the semiconductor integrated circuit device. The procedure for the wiring placement in FIG. 10 is described next.

FIG. 7 shows the relative positions of the start point group and the end point group. A start point group made up of the eight start points A through H; and an end point group made up of eight end points A' through H' are respectively arrayed in straight lines. The straight line formed by the start point group and the straight line formed by the end point group intersect each other. Though the example described here utilizes eight sets with a start point and an end point as one set, the following discussion is not limited to eight sets.

FIG. 8 is a drawing showing the horizontal wiring length (namely the direction along the end points). As seen in FIG. 8, eight wires of different lengths in parallel with the end point group are needed when each individual start point is connected to an individual end point in a one-to-one relation formed by a wiring group in parallel with the end point group and a wiring group in parallel with the start point group.

FIG. 9 shows the progression of mask data in the wiring placement as the wiring process of the conventional art proceeds. FIG. 9 shows the wiring along the horizontal direction for the case where making the length of each wire connecting the start point and the end point equal.

FIG. 10 is a drawing showing the progression of mask data in the wiring placement during the wiring process of the conventional art. Here, the wiring group in the vertical direction (in other words, along the start point group direction) connects the end point group and wiring group of FIG. 9 on different layers than the wiring groups in FIG. 9. Contacts (not shown in drawing) are placed at the sections connecting the horizontal wiring group and the vertical wiring group.

The start points and the end points are connected by wiring spanning two layers. All wiring connecting the start points and the end points can be placed on two layers by using a different layer for each wiring direction. Therefore, the wiring placement shown in FIG. 10 is mostly used. Moreover, even though the wiring lengths on each layer are different, the wires joining the start points and end points are a fixed length. However, the wire placement shown in FIG. 10 has the problem that the side wall capacitance increases as the device process rule shrinks and the gaps between adjacent wiring become narrower.

FIG. 11 shows the parallel wiring disclosed in the patent document 1 for resolving the problems of the conventional art. The differential transmission line paths (L1a, L1b), (L2a, L2b), (L3a, L3b) are placed on the Si (silicon) substrate 20 within the LSI. Each of the signal lines for the differential transmission line paths (for example L1a and L1b) is formed at positions diagonally opposite the horizontal direction (standard direction). An Inter-Layer Dielectric, ILD10 is formed between the wiring of each differential transmission line paths.

The signal lines L1a, L1b, L2a, L2b, L3a, L3b, are all made from metallic material such as aluminum. The ILD10 is made from $SiO_2$, etc.

The parallel wirings disclosed in patent document 1 are multiple differential line paths formed in parallel with each other in the standard direction. Each of these differential line paths includes two lines approximately in parallel. Here, a unique feature is that the wiring layers of these two lines can be changed. The side wall capacitance can in other words be suppressed by extending the distance between adjacent lines.

Patent document 2 discloses a method for minimizing signal delay caused by parasitic CR among wiring when multiple signal wires are in parallel with each other, by adjusting the gap between adjacent signal lines or signal line widths.

[Patent document 1] Japanese Unexamined Patent Application Publication No. 2005-101587

[Patent document 2] Japanese Unexamined Patent Application Publication No. Hei06(2004)-302694

SUMMARY

The following analysis was implemented by the inventors. The method disclosed in patent document 1 is capable of reducing the side wall capacitance. Applying the method of patent document 1 to the wiring in FIG. 7 however yields the mask data shown in FIG. 12 so that electrical shorts occur at points between the adjacent signal wiring. In other words, utilizing the method in patent document 1 does not allow placing wiring on two layers in the conventional art.

In the wiring placement method of the background art shown in FIG. 10, electrical shorts do not tend to occur between the wires however this method has the problem that side wall capacitance increases. In other words, there is a tradeoff between reducing the side wall capacitance and reducing the number of wiring layers.

A longest wiring and a shortest wiring alongside each other among the plurality of wirings are placed. Then, a longest wiring from among remaining wires which have not placed yet, alongside an outside of a space surrounded by the wirings already placed and on a side of a shorter wiring of the wrings placed at most outer ends are placed. A shortest wiring from among remaining wires which have not placed yet, alongside an outside of a space surrounded by the wirings already placed and on a side of a longer wiring of the wirings placed at most outer ends is placed. These two processes are repeated.

The wiring placement method of the exemplary aspects of the present invention is capable of easily reducing parasitic capacitance between wiring without increasing the number of wiring layers. The aspects can accomplish this because long wires are not placed alongside each other and short wires are not placed alongside each other so that the overall side wall capacitance between wires can be reduced. Moreover, in the aspects the wires can be placed without increasing the number of wiring layers. The wiring placement method of the aspects also reduce timing delays and reduces power consumption, while also improving the performance of the semiconductor integrated circuit device.

BRIEF DESCRIPTION OF THE DRAWINGS

The above and other exemplary aspects, advantages and features of the present invention will be more apparent from the following description of certain exemplary Embodiments taken in conjunction with the accompanying drawings, in which:

FIG. 5 is a drawing for comparing the wiring placement method of the background art with the wiring placement method of the first working example of this invention;

DETAILED DESCRIPTION OF THE EXEMPLARY EMBODIMENTS

First Exemplary Embodiment

Figure 1:
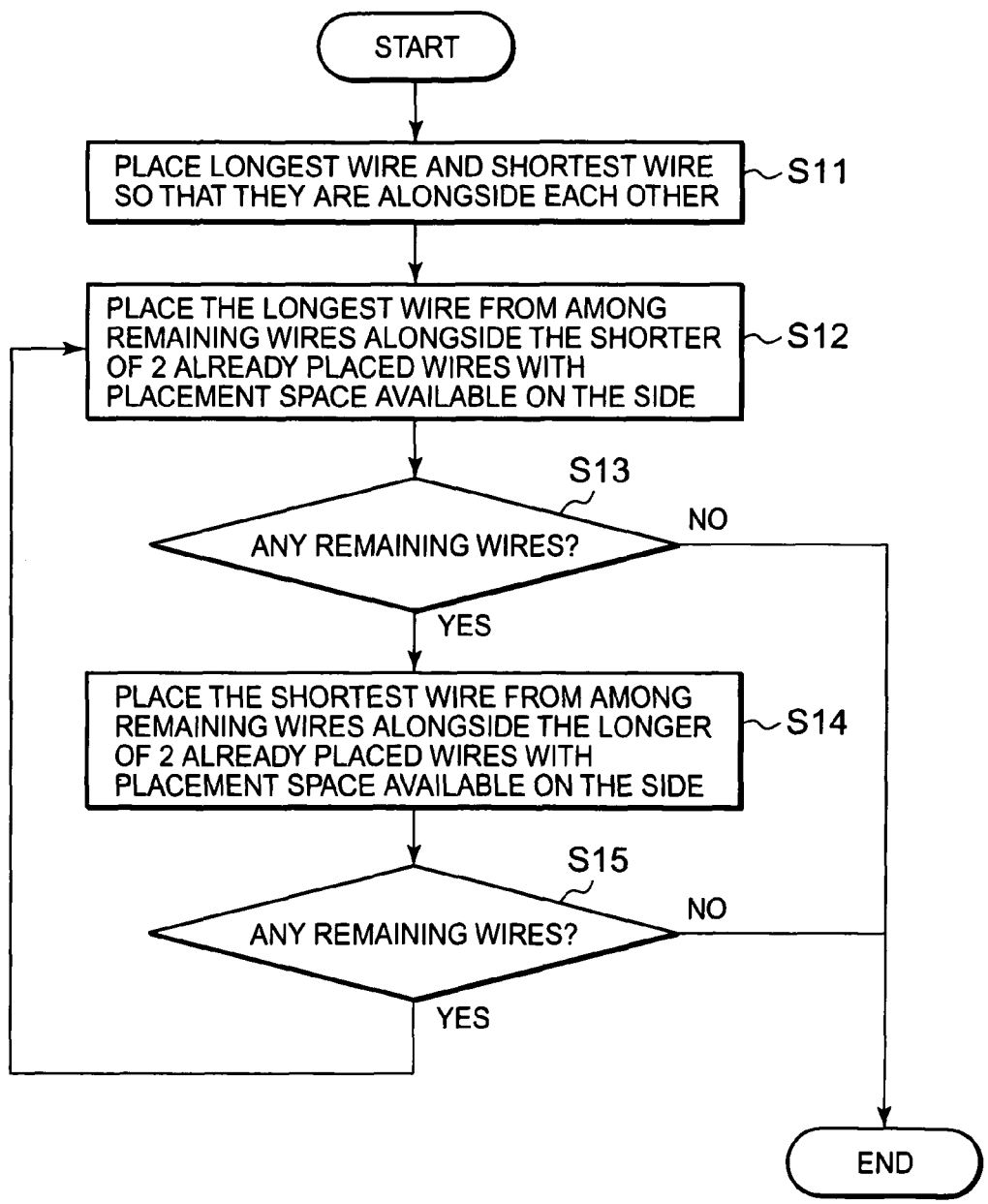
FIG. 1 is a flow chart of the wiring placement method of the Exemplary Embodiment of this invention.

The wiring placement method of the first Exemplary Embodiment of the present invention is described next while referring to the drawings. FIG. 1 is a flowchart showing the wiring placement method of this invention.

The wiring placement method of this invention is a method for placing multiple wiring in parallel on a flat plane. Examining FIG. 1 shows that wire is first of all placed so that the longest wire is placed alongside the shortest wire (step S11). Next, the process (step S12) for placing the longest wire from among the remaining wires alongside the shorter of two already placed wires with space available on the side; and the process (step S14) for placing the shortest wire from among the remaining wires alongside the longer of two already placed wires with space available on the side; are alternately performed until there are no remaining wires (No for step S13 or step S15). Here, the step S12 and the step S14 may be interchanged within the process sequence.

Second Exemplary Embodiment

The wiring placement method of the second Exemplary Embodiment of the present invention is described next while referring to the drawings. In this Exemplary Embodiment, along with placing the vertical wires and the horizontal wires on respectively different layers, the short wires are routinely placed alongside the long wires.

Figure 7:
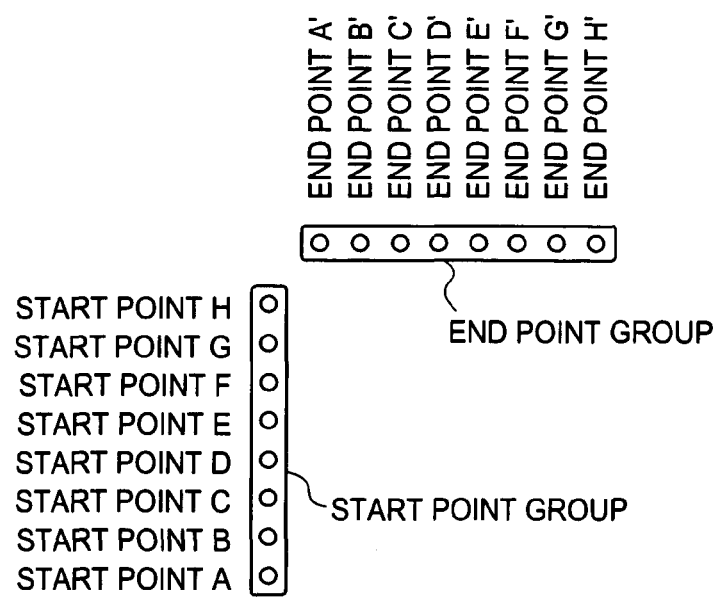
FIG. 7 is a drawing for describing the placement of the start point group and the end point group.
Figure 8:
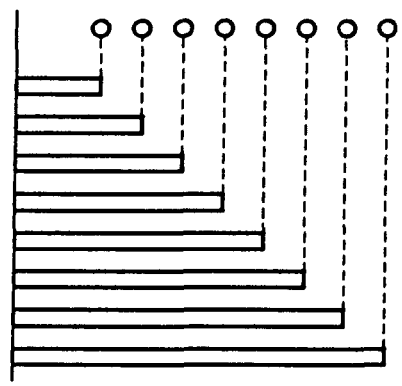
FIG. 8 is a drawing for describing the wiring placement method of the background art.
Figure 9:
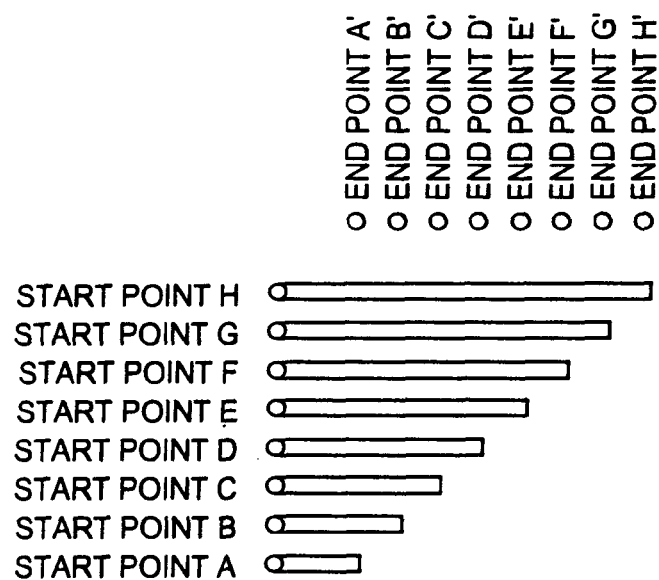
FIG. 9 is a drawing showing the mask data that was placed based on the wiring placement method of the background art.
Figure 10:
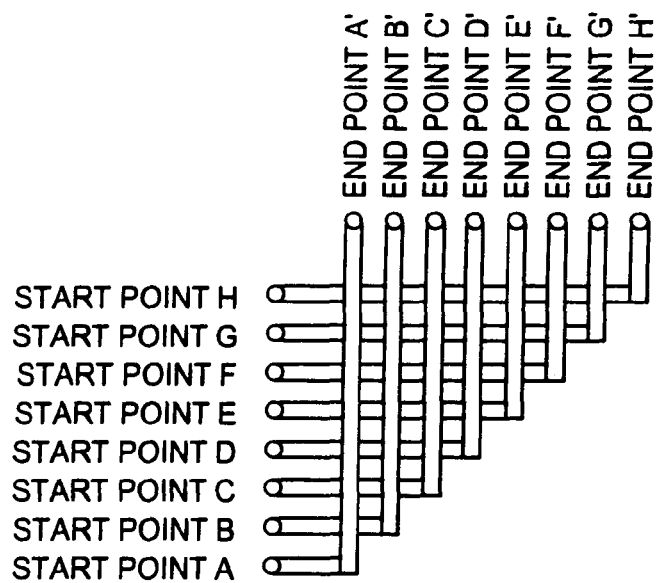
FIG. 10 is a drawing showing the mask data that was placed based on the wiring placement method of the background art.
Figure 11:
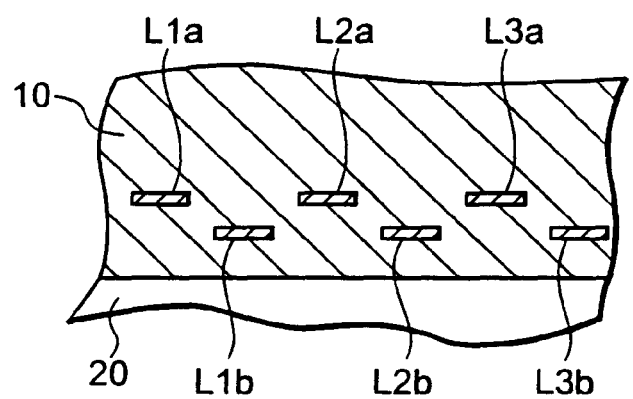
FIG. 11 is a drawing for describing the wiring placement method of patent document 1.
Figure 12:
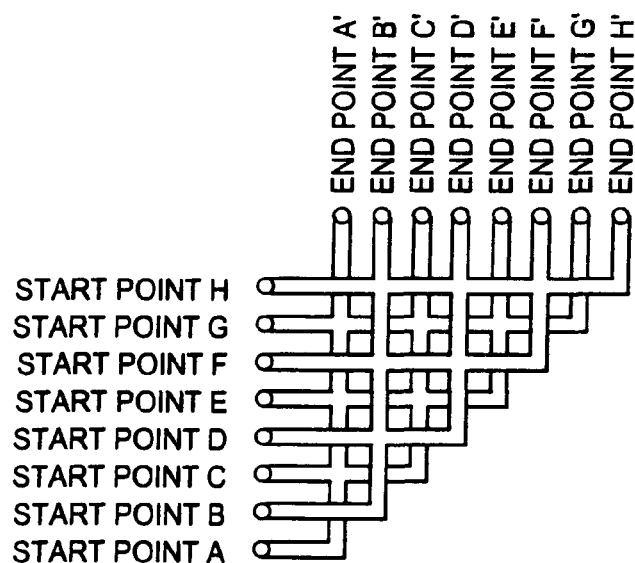
FIG. 12 is a drawing showing the mask data that was placed based on the wiring placement method of patent document 1.

A placement method for wires joining a start point group containing multiple start points A-H with an end point group containing multiple end points A'-H' formed on one region of the semiconductor integrated circuit is considered next while referring to FIG. 7. The start point group A-H here are on one straight line, and the end point group A'-H' are on the other straight line. These straight lines intersect each other. The wires extending from each start point in one direction (direction parallel to straight lines from end point group) are from hereon called a wiring group. The wires are preferably placed at this time so that the shortest wire in the wiring group is at the start point in roughly the center of the start point group, and then alternately placing the shortest and the longest remaining wires.

Figure 2:
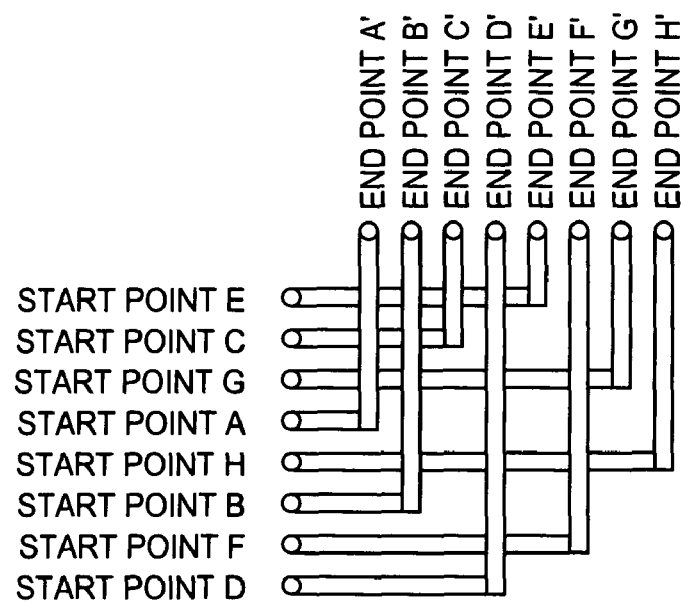
FIG. 2 is a drawing for describing the wiring placement method of the first working example of this invention.

Also, after placing the shortest wire, the process for placing the longest remaining wire in the wiring group and connecting it to the shortest adjacently connectable already placed wire, and the process for placing the shortest remaining wire in the wiring group and connecting it to the longest adjacently connectable already placed wire, are alternately repeated until all wires in the group have been placed. The placed wires are then preferably connected to the end points and the start point group and end point group are mutually connected (FIG. 2).

FIRST WORKING EXAMPLE

Figure 3:
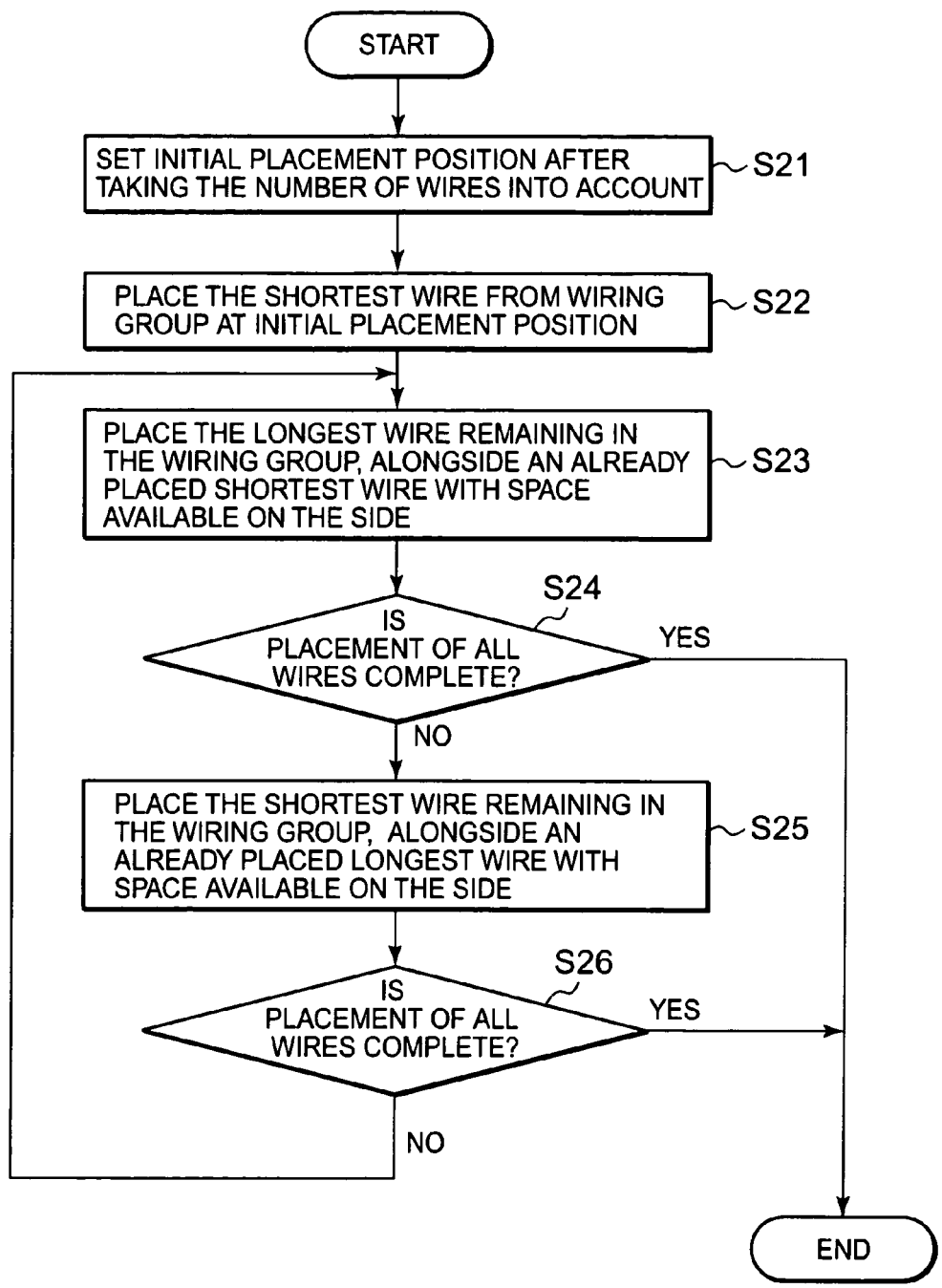
FIG. 3 is a flow chart of the wiring placement method of the first working example of this invention.

The wire placement method for the first working example of this invention is described next while referring to the drawings. FIG. 2 shows the mask data when the wires were placed in this working example. The procedure for achieving the mask data of FIG. 2 is described in detail next. FIG. 3 is a flow chart showing the wire placement where wires were placed in the horizontal direction (direction where end points in FIG. 2 are arrayed in a straight line) by using the wire placement method of this working example.

Figure 4A:
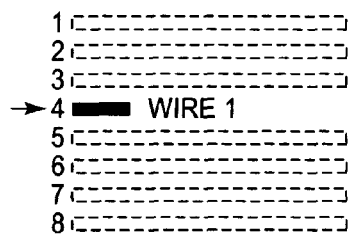
FIGS. 4A to H are drawings each for describing the wiring placement method of the first working example of this invention.

The position for placing the first wire is decided after considering the number of wires (step S21). The serial numbers 1-N (N is a natural number) are assigned to locations capable of wire layout as shown in FIG. 4(a). FIG. 4 shows the case where N=8. If placing N wires, then the wires are first placed at the N/2-th position when N is an even number, and at the (N+1)/2th position when N is odd number (step S21). The shortest wire among the wiring group is placed at this initial position (step S22).

The longest wire remaining in the wiring group is placed alongside the shortest already placed wire having an open space on the side (step S23). A decision is made here whether placing of all wires is complete (step S24). If complete, (Yes in step S24) then the process terminates. However if not complete (No in step S24), then the process returns to step S25.

The shortest wire remaining in the wiring group is placed alongside the longest already placed wire having an open space on the side (step S25). A decision is made here whether placing of all wires is complete (step S26). If complete, (Yes in step S26) then the process terminates. However if not complete (No in step S26), then the process proceeds to step S23.

The wiring placement for the horizontal direction is set by repeating the process for steps S23-S26 until all the wires have been placed. After setting the wiring placement in the horizontal direction, the wire placement shown in FIG. 2 is obtained by routing the vertically oriented wires towards the end point.

The related position when wiring the start point group and the end point group positions in FIG. 7 is discussed next based on the wiring placement method of this Exemplary Embodiment. FIG. 4A through FIG. 4H show the on-going progress during the wire placement. The black colored wires are wires whose placement is complete. The locations with the dashed lines indicate regions where wiring can be placed. The locations with the arrows (→) indicate the wire that was placed last.

Lines along the horizontal direction (in other words, direction shown by line where end points are arrayed) are called line L1, line L2, line L3, ..., and line L8 in order of short line length. Since there are eight lines at present, the initial placement position becomes N/2=4 (step S21). The shortest line L1 is therefore placed at position 4 (FIG. 4A) (step S22).

Figure 4B:
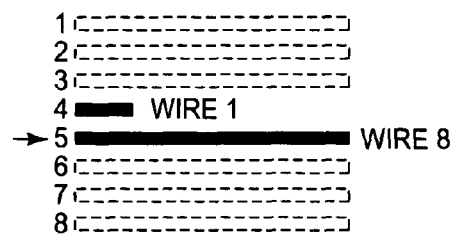

The wire L8 which is the longest among the remaining wires is next placed along side the shortest already placed wire L1 (step S23) having an open space available on the side (step S23). Only the L1 wire has been placed at this time so both sides of wire L1 are available. The wiring is in this case preferably placed on the side where more remaining wires can be placed, in other words the wires can be placed on the lower side of wire L1 (FIG. 4B).

Figure 4C:
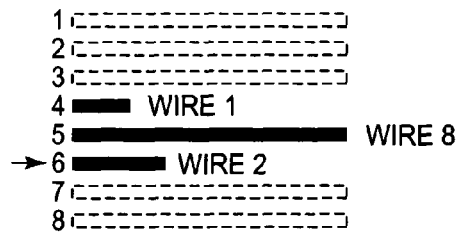

Next, the wire L2 which is the shortest among the remaining wires is placed alongside the longest already placed wire with space available on the side (step S25). Examining FIG. 4B shows that even though the upper side of longest wire L8 is unavailable, the lower side is available. The wire L2 is thereupon placed on the lower side of wire L8 (FIG. 4C).

Figure 4D:
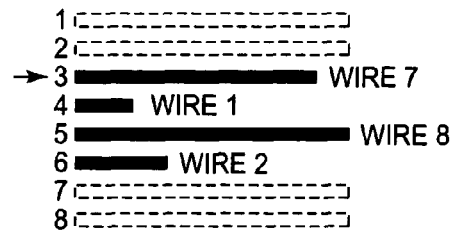

The wire L7 which is the longest among the remaining wires is placed alongside the shortest already placed wire with space available on the side (step S23). Examining FIG. 4C shows that even though the lower side of longest wire L7 is unavailable, the upper side is available. The wire L7 is thereupon placed on the upper side of wire L7 (FIG. 4D).

Figure 4E:
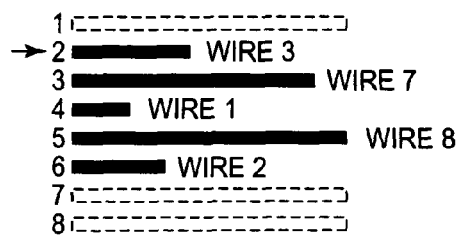

The wire L3 which is the shortest among the remaining wires in the wiring group is placed alongside the longest already placed wire (step S25). Wires on both sides of the longest wire L8 are unavailable so a check is next made of the side along the next longest wire L7. Examining FIG. 4D shows that the upper side of the wire L7 is available so the wire L3 is placed on the upper side of the wire L7 (FIG. 4E).

Figure 4F:
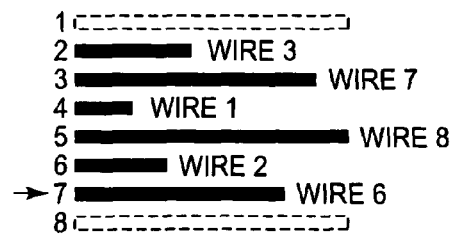
Figure 4G:
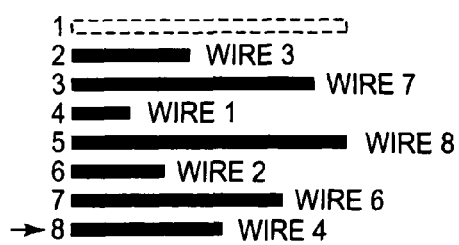
Figure 4H:
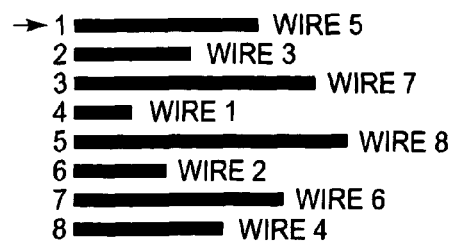

Thereafter, the longest and the shortest wires among the remaining wires are alternately placed (FIG. 4F through FIG. 4H). FIG. 2 shows the wiring after all-wire placement has been set and vertical lines were routed to connect to the end points. Contacts are mounted at locations where vertical wires and horizontal wires overlap.

The material (aluminum, copper, tungsten, etc.) used in the wiring usually have a high dielectric constant (inductance) compared to material in the insulating layers between the wiring. The capacitance of this wiring therefore changes according to whether there is another wire alongside.

Placing the wires by utilizing the wire placement method of this working example allows always placing the shortest wire on both sides of the longest wire and then placing the next short wire. In this working example, long wires are enclosed on both sides by short wires. In this placement method, the long wire in many sections has no wire alongside. The wiring placement method of this working example can therefore lower the capacitance compared to conventional wiring placement methods.

FIG. 5 shows the wiring capacitance in this working example (FIG. 2) and an example of the background art. When the total wiring capacitance of the background art is here set as 1, the total wiring capacitance of the present invention is approximately 0.9, which is about a 10 percent reduction in wiring capacitance.

Moreover, the start points and end points can be connected by forming the horizontal wires and the vertical wires on respectively different layers. Namely, there is no need to increase the number of layers such as required when using the method of patent document 1.

SECOND WORKING EXAMPLE

Figure 6:
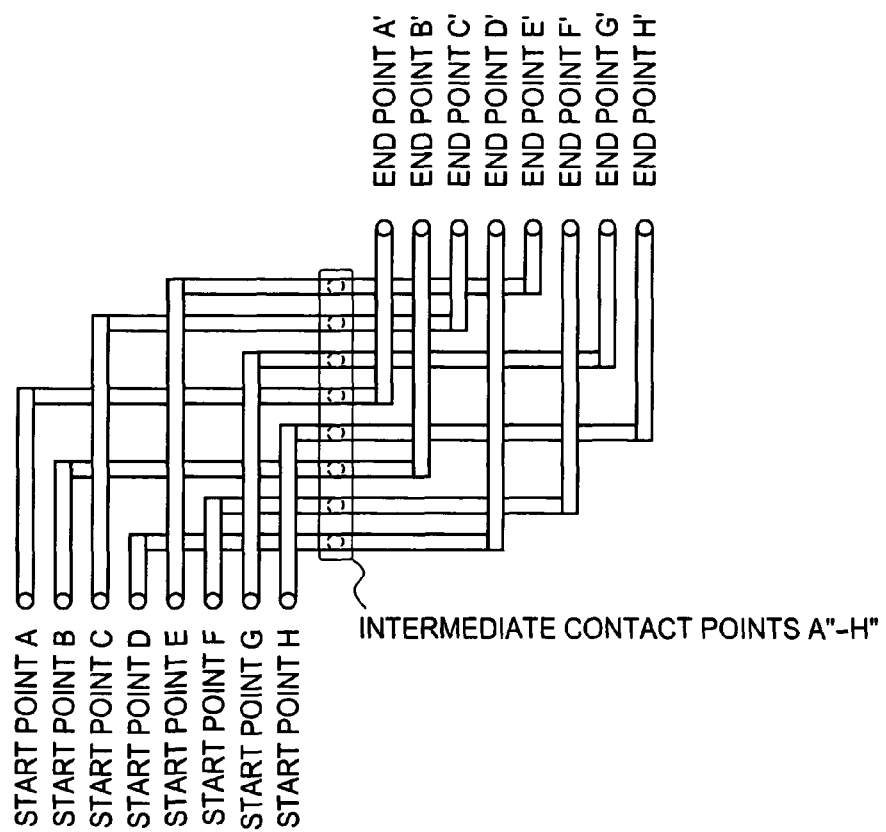
FIG. 6 is a drawing for describing the wiring placement method of the second working example of this invention.

The second working example of the present invention is described next while referring to the drawings. The start point direction and the end point direction mutually intersected each other in the above first working example and the prior art. However, the wiring placement method of the present invention is even usable in cases such as FIG. 6 where the start points and the end points are arrayed parallel to each other. A virtual intermediate contact point groups A"-H" can be formed to divide the start point group and end point group into two sections. At these times, the capacitance within the wiring can be reduced by applying the above wiring method in the first working example between the start point groups A-H and intermediate contact point groups A"-H", as well as between the end point groups A'-H' and intermediate contact point groups A"-H".

THIRD WORKING EXAMPLE

The wiring placement method of the third working example of the present invention is described next while referring to the drawings.

Figure 13:
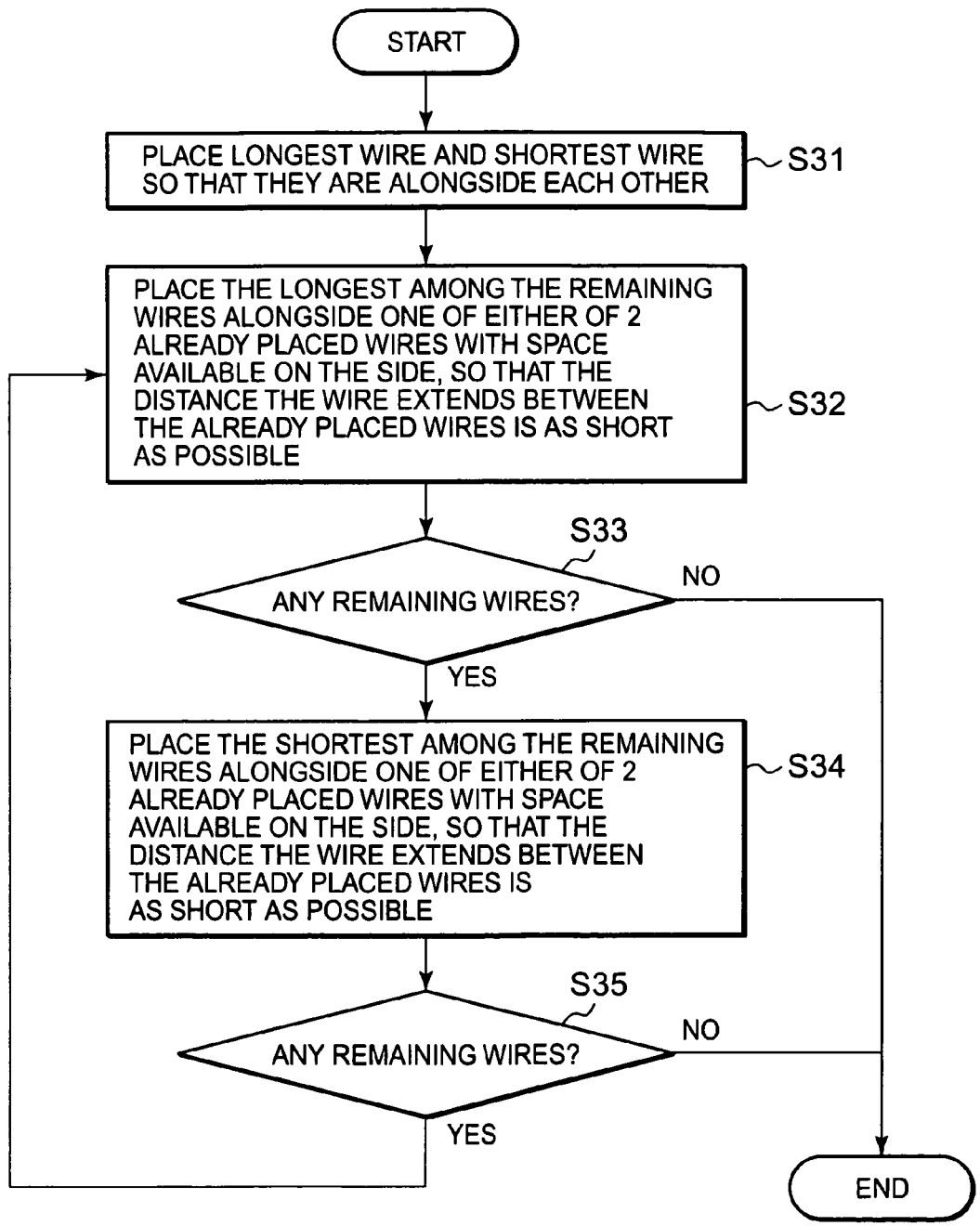
FIG. 13 is a drawing for describing the wiring placement method of the third working example of this invention.

FIG. 13 is a flow chart of the wiring placement method of this working example.

The wiring placement method of this working example is a method for placing multiple wires of different lengths in parallel on a flat plane. The wires are first of all placed so that the longest wire and the shortest wire are alongside each other as shown in FIG. 13 (step S31). Next, the method includes placing the longest wire among the remaining wires and the shortest wire among the remaining wires, so that the wires are placed in parallel with one among either of two already placed wires with space available on the side, so as to set the shortest possible distance that the wire extends in parallel among the already placed wires, and alternately repeating this wire placement (No in step S32 or step S34) until there are no remaining wires (No in step S33 or step S35). The step 32 and the step 34 order may here be interchanged with each other.

The above description was based on the working examples but the present invention is not limited by the working examples.

Further, it is noted that Applicant's intent is to encompass equivalents of all claim elements, even if amended later during prosecution.

What is claimed is:

1. A semiconductor integrated circuit device including a plurality of wirings of different lengths placed in parallel on a plane, said semiconductor integrated circuit device comprising:
   a 1st longest wiring being arranged to extend in a first direction among the plurality of wirings;
   a 1st shortest wiring among the plurality of wirings adjacently being placed to the 1st longest wiring, said 1st shortest wiring being arranged in parallel with said 1st longest wiring along said first direction;

a (n+1)th shortest wiring, longer than said 1st shortest wiring, adjacently being placed to a (n)th longest wiring, at an outside of a place which is surrounded by a (n)th shortest wiring, shorter than said (n+1)th shortest wiring, and the (n)th longest wiring, said (n+1)th shortest wiring being arranged in parallel with said 1st longest wiring along said first direction, said (n+1)th shortest wiring being longer than said (n)th shortest wiring; and a (n+1)th longest wiring, shorter than said (n)th longest wiring, adjacently being placed to the (n)th shortest wiring at an outside of a place which is surrounded by the (n)th shortest wiring and the (n)th longest wiring, said (n+1)th longest wiring being arranged in parallel with said 1st shortest wiring along said first direction, wherein n is an integer greater than or equal to 1.

2. The semiconductor integrated circuit device as claimed in claim 1, wherein a wire parallel with the wirings is arranged other than between the wirings.

3. The semiconductor integrated circuit device as claimed in claim 1, further comprising:

a first wiring group constituted by a portion of the wirings and extending in the first direction; and a second wiring group constituted by another portion of the wirings and extending in a second direction perpendicular to the first direction.

4. The semiconductor integrated circuit device as claimed in claim 1, further comprising:

a first wiring group constituted by a portion of the plurality of wirings and extending in the first direction;

a second wiring group constituted by another portion of the plurality of wirings and extending in the first direction; and an intermediate wiring group extending in a second direction perpendicular to the first direction to connect the first wiring group with the second wiring group.

* * * * *